United States Patent [19]

Fischer et al.

[11] 4,451,778
[45] May 29, 1984

[54] SHORT-CIRCUIT-RESISTANT TRIGGER CIRCUIT LAYOUT FOR AN ELECTRICAL CONSUMER

[75] Inventors: Werner Fischer, Ditzingen; Johannes Locher, Stuttgart, both of Fed. Rep. of Germany

[73] Assignee: Robert Bosch GmbH, Stuttgart, Fed. Rep. of Germany

[21] Appl. No.: 382,451

[22] Filed: May 24, 1982

[30] Foreign Application Priority Data

Jul. 16, 1981 [DE] Fed. Rep. of Germany ....... 3128116

[51] Int. Cl.³ ................................................ G05F 1/56
[52] U.S. Cl. .................................... 323/282; 323/351; 361/18
[58] Field of Search ....................... 323/282, 289, 351; 361/18

[56] References Cited

U.S. PATENT DOCUMENTS

| | | | |
|---|---|---|---|
| 3,597,657 | 8/1971 | Fredricsson | 323/282 X |
| 3,654,518 | 4/1972 | Phelps et al. | 323/282 X |
| 4,055,794 | 10/1977 | Ickes et al. | 323/289 |
| 4,355,277 | 10/1982 | Davis et al. | 323/351 |

Primary Examiner—William M. Shoop
Attorney, Agent, or Firm—Edwin E. Greigg

[57] ABSTRACT

A short-circuit-resistant trigger circuit layout is proposed for an electrical consumer for motor vehicles. The trigger circuit layout is located in series with a switching transistor, which is preceded in turn by an operational amplifier whose negative input is coupled with the junction point of two resistors parallel to the transistor and whose positive input receives both an average constant potential and a dynamic switching signal. In case of error, that is, in case of a short-circuit consumer, the transistor, which has initially been switched on, switches back into its blocked state after a predetermined time constant has elapsed. The short-circuit current flowing during this open phase can be limited by means of a resistor in series with the transistor.

3 Claims, 1 Drawing Figure

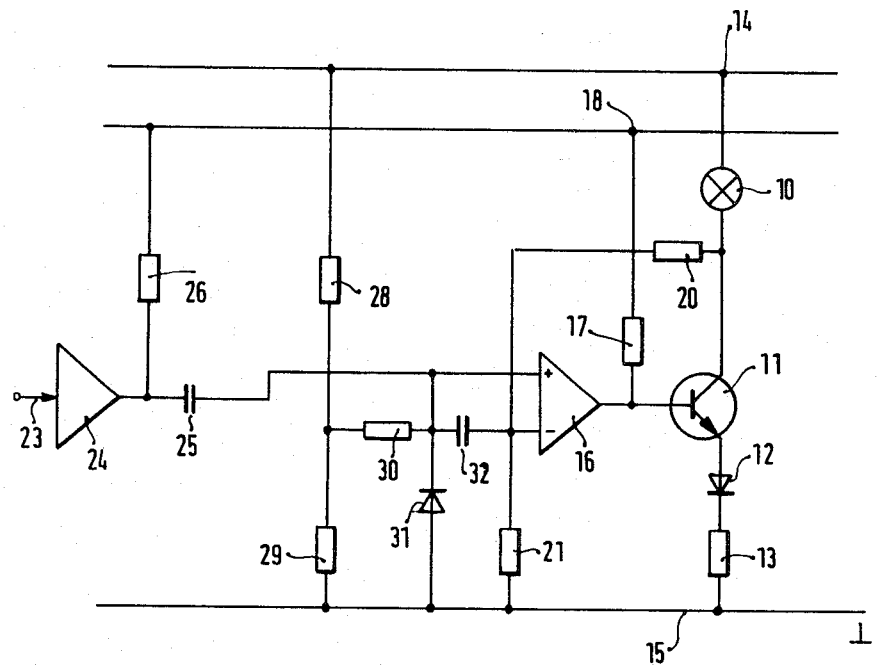

SHORT-CIRCUIT-RESISTANT TRIGGER CIRCUIT LAYOUT FOR AN ELECTRICAL CONSUMER

BACKGROUND OF THE INVENTION

Short-circuit-resistant trigger circuit layouts are required as a rule whereever it is important to have great reliability. It is known, for instance, to supply an electrical consumer first with a test pulse and only to feed the primary signal to the electrical consumer after a reaction has occurred indicating correct functioning of the consumer. A circuit layout of this kind is not entirely problem-free, and particularly in large-scale mass production, it is not optimal.

OBJECT AND SUMMARY OF THE INVENTION

It is an object of the invention to provide an improved short-circuit-resistant circuit layout.

The short-circuit-resistant circuit layout of the invention includes an operational amplifier, the positive input of which receives an average constant potential as well as a dynamic switching signal, and the negative input of which is coupled to the junction point of a voltage divider which is situated in parallel with a transistor switch connected in series with the electrical consumer.

In case of error, that is, in case of a short-circuited consumer, the transistor, which has initially been switched on, switches back into its blocked state after a predetermined time constant has elapsed.

The short-circuit-resistant trigger circuit layout according to the invention has the advantage over the prior art that it is simple, favorable in price and thus reliable as well, because it can be realized without a multiplicity of addtional components.

The invention will be better understood and further objects and advantages thereof will become more apparent from the ensuing detailed description of one preferred embodiment taken in conjunction with the single FIGURE of the drawing.

BRIEF DESCRIPTION OF THE DRAWING

The single FIGURE of the drawing shows a short-circuit-resistant trigger circuit layout for an electrical consumer according to the invention.

DESCRIPTION OF THE PREFERRED EMBODIMENT

The drawing shows a short-circuit-resistant trigger circuit layout for an electrical consumer in a motor vehicle. This consumer is indicated by reference numeral 10 and is disposed in series with a transistor 11, a diode 12 and a resistor 13 between a battery voltage line 14 and a ground line 15. The transistor 11 is triggered by an operational amplifier 16, and the base of the transistor 11 is additionally coupled via a resistor 17 to a line 18 for a constant supply voltage. A voltage divider comprising two resistors 20 and 21 is located, at one end, between the junction point of the consumer 10 and the transistor 11. The middle point of this voltage divider is connected with the negative input of the operational amplifier 16. The trigger signal for the operational amplifier 16 proceeds from a connection terminal 23 to a preamplifier 24 and from the output thereof via a capacitor 25 to the positive input of the operational amplifier 16. On the output side, the preamplifier 24 is additionally connected via a resistor 26 to the positive line 18. A further voltage divider comprising two resistors 28 and 29 is located between the battery voltage line 14 and the ground line 15, and the connecting point of the two resistors 28, 29 is connected, via a resistor 30, to the positive input of the operational amplifier 16. In addition, this positive input is connected to the ground line 15 via a diode 31 whose polarity is in the blocking direction. The two inputs of the operational amplifier 16 are finally connected to one another by a capacitor 32.

The circuit layout described briefly above functions as follows:

If the consumer 10 (a lamp is shown) is switched on, then a lower voltage is present at the negative input of operational amplifier 16 than at the positive input, because the voltage at the positive input is formed statically by means of the voltage divider ratio of the two resistors 28 and 29. By means of the positive voltage and the resistor 17, the transistor 11 remains conductive at its base. If there is a negative voltage jump at the terminal 23, then because of the switchover of the preamplifer 24 a corresponding voltage drop also occurs at the positive input of the operational amplifier 16, so that the output signal of the operational amplifier 16 is switched over and accordingly blocks the transistor 11. During this process, the diode 31 functions to limit the voltage in that the potential at the input of the operational amplifier 16 can fall below zero only by the amount of voltage passed by the diode 31. However, if the transistor 11 switches, then the voltage at the negative input of the operational amplifier 16 increases and exceeds the value of the static voltage at the positive input. After the fading of the negative dynamic voltage pulse at the positive input, the output signal of the operational amplifier 16 again blocks the transistor 11. A change in the electrical behavior now occurs only once the potential at the input termainl 23 undergoes a positive jump. In that case, the positive jump is transmitted by the capacitor 25 to the positive input of the operational amplifier 16, and the operational amplifier switches the transistor 11 through again. This voltage increase fades once again to the voltage fixed by the resistors 28 and 29, the fading occurring with a time constant substantially formed from the values of the resistor 30 and capacitor 25. If the electrical consumer 10 is operating correctly, that is, if it is not short-circuited, then because of the internal resistance of the consumer 10 the voltage at the negative input of the operational amplifier 16 drops to such an extent that the voltage at the positive input, even after the fading of the input pulse, is still greater than that at the negative input. In this case, the transistor 11 continues to be controlled such that it is conductive, and the electrical consumer 10 is thus operated in its active state.

However, if the consumer 10 has a short circuit, then the potential at the negative input of the operational amplifier 16 remains at a high level. Accordingly, the transistor 11 is blocked once again after the switch-on pulse has faded. During the period of time in which the transistor 11 is controlled to be conductive during the switch-on pulse, the maximum current is limited to a value determined by the voltage 18, the base-emitter voltage of the transistor 11, the forward voltage of the diode 12 and a value determined by the dimensions of the resistor 13. This value is naturally selected to be so high that during this short conductive period, it is still not possible for any danger to occur to transistor 11.

The capacitor 32 serves to filter out high frequency interfrerence pulses on the two input lines of the operational amplifier 16.

Diode 12 serves as a means for protecting against incorrect polarities.

With the above-described short-circuit-resistant trigger circuit layout for an electrical consumer, the opportunity is thus provided of being able to realize a safety circuit in the simple, cost-favorable and reliable manner, which is capable of meeting stringent demands.

What is claimed and desired to be secured by Letters Patent of the United State is:

1. A short-circuit-protection trigger circuit layout for an electrical consumer, the consumer being connected in series with a switching transistor, comprising:
   an operational amplifier connected to the switching transistor for raising and lowering the conductivity thereof;
   a voltage divider comprising resistor means connected in parallel to the switching transistor;
   means for providing an average constant potential; and
   means for providing a dynamic switching signal, wherein:
   (i) one input of the operational amplifier is connected to the junction point of the voltage divider; and
   (ii) the other input of the operational amplifier is connected to the means for providing an average constant potential and to the means for providing a dynamic switching signal.

2. The short-circuit-resistant trigger circuit layout as defined in claim 1, further comprising:
   a resistor connected in series with the switching transistor, and wherein:
   (iii) the resistor and switching transistor bridge the voltage divider.

3. The short-circuit-resistant trigger circuit layout as defined in claim 2, further comprising:
   a ground line, and
   a diode, wherein:
   (iv) said diode is connected between the ground line and the positive input of the operational amplifier in a blocking mode.

* * * * *